United States Patent
Sakamoto

(10) Patent No.: US 7,626,402 B2
(45) Date of Patent: Dec. 1, 2009

(54) SEMICONDUCTOR DEVICE AND METHOD OF MEASURING SHEET RESISTANCE OF LOWER LAYER CONDUCTIVE PATTERN THEREOF

(75) Inventor: Hideo Sakamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 293 days.

(21) Appl. No.: 11/838,252

(22) Filed: Aug. 14, 2007

(65) Prior Publication Data
US 2008/0284452 A1 Nov. 20, 2008

(30) Foreign Application Priority Data
Aug. 15, 2006 (JP) .............................. 2006-221606

(51) Int. Cl.
*G01R 31/26* (2006.01)
(52) U.S. Cl. .................... 324/719; 324/722; 324/763
(58) Field of Classification Search ................ 324/719
See application file for complete search history.

(56) References Cited

U.S. PATENT DOCUMENTS

| | | | |
|---|---|---|---|
| 6,403,389 B1* | 6/2002 | Chang et al. | 438/18 |
| 6,518,592 B1* | 2/2003 | Amishiro et al. | 257/48 |
| 7,061,256 B2* | 6/2006 | Hasegawa | 324/719 |
| 2005/0017746 A1* | 1/2005 | Matsumoto et al. | 324/763 |
| 2005/0052191 A1* | 3/2005 | Prussin | 324/719 |
| 2005/0225345 A1* | 10/2005 | Mazur et al. | 324/757 |
| 2006/0012384 A1* | 1/2006 | Okajima | 324/719 |
| 2006/0071676 A1* | 4/2006 | Chen et al. | 324/719 |
| 2009/0058434 A1* | 3/2009 | Lin et al. | 324/719 |
| 2009/0079446 A1* | 3/2009 | Chatterjee et al. | 324/719 |

FOREIGN PATENT DOCUMENTS

JP 2001-313323 11/2001

* cited by examiner

Primary Examiner—Timothy J Dole
Assistant Examiner—Benjamin M Baldridge
(74) Attorney, Agent, or Firm—Young & Thompson

(57) ABSTRACT

Contact holes (openings) (17) are created in the upper electrode (14) and the dielectric film (15) of a polysilicon-insulator-polysilicon (PIP) capacitive element to form a plurality of evaluation patterns wherein the lower electrode (13) and upper layer wiring lines (20) for measurement are electrically connected through contacts (16). At least four evaluation patterns are created by a combination of two or more values of a distance L with different values of a width W. Since it can be assumed that a difference in the resistance value between the respective evaluation patterns is only due to the effect of a change in a rectangular region (W*L) between the contact holes (openings) (17), it is possible to easily calculate the sheet resistance of the high-resistance portion from a change in the resistance value of each of the measurement patterns.

11 Claims, 6 Drawing Sheets

| No. | W (μm) | L (μm) |
|---|---|---|
| 1 | 2 | 2 |
| 2 | 4 | 2 |
| 3 | 10 | 2 |
| 4 | 2 | 5 |
| 5 | 4 | 5 |
| 6 | 10 | 5 |

FIG. 7
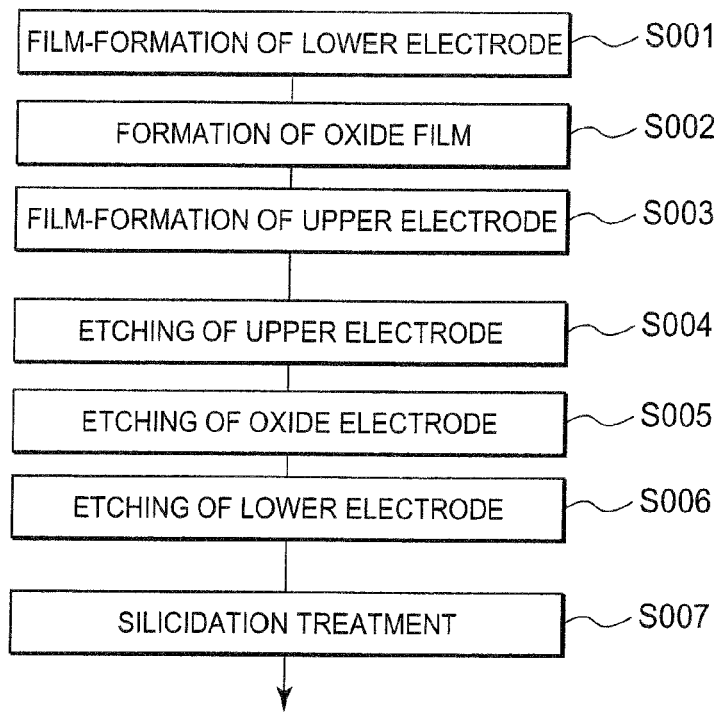
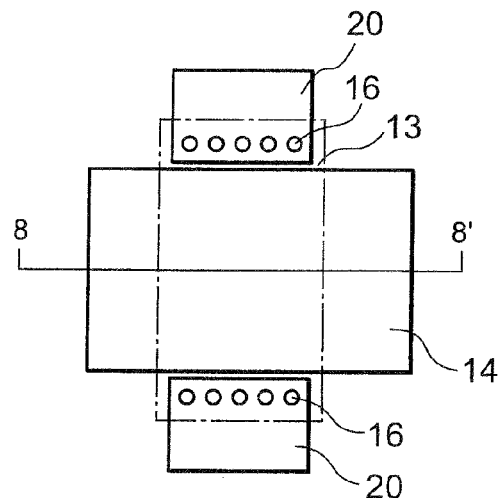
FIG. 8a
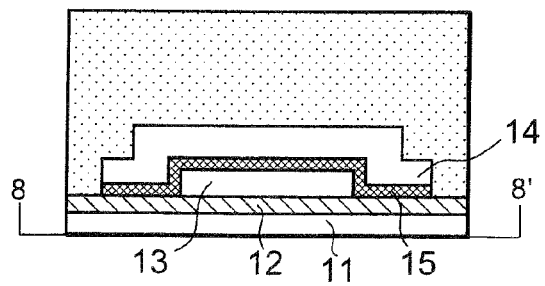
FIG. 8b

SEMICONDUCTOR DEVICE AND METHOD OF MEASURING SHEET RESISTANCE OF LOWER LAYER CONDUCTIVE PATTERN THEREOF

BACKGROUND OF THE INVENTION

1. Field of the Invention

The present invention relates to a semiconductor device and a method of measuring a sheet resistance of a lower layer conductive pattern thereof and, more particularly, to a semiconductor device containing an element configured by sandwiching an insulating layer between a lower layer conductive pattern and an upper layer conductive pattern, the outline of which is smaller than that of the lower layer conductive pattern, and to a method of measuring a sheet resistance of the lower layer conductive pattern.

2. Description of the Related Art

As the semiconductor device process becomes finer and the semiconductor device performance becomes higher, it has become increasingly important to extract the exact parasitic effect of an element fabricated on a semiconductor substrate. In an analog circuit in particular, since the parasitic effect has a significant influence on electric power and electrical operation, it has become important to measure the exact parasitic effect and perform high-precision circuit simulation using the results of measurement.

For example, Japanese Patent Laid-Open No. 2001-313323 discloses an evaluation pattern whereby it is possible to measure the sheet resistance of a MOSFET source-drain diffusion layer, particularly the sheet resistance in the gate length direction thereof and the resistance of a portion overlapping with a gate electrode.

Incidentally, some elements have two (small and large) values of parasitic resistance on the lower layer conductive pattern (lower electrode) of a substrate due to constraints on a production process for fabricating transistors and the like on the same substrate. Consequently, there is a problem that it is difficult to estimate the sheet resistance of a high-resistance portion since this portion is affected by the low-resistance portion of the lower layer conductive pattern (lower electrode).

Now, a detailed explanation will hereinafter be made in this regard with an example of a polysilicon-insulator-polysilicon (PIP) capacitive element wherein the above-described problem surfaces notably.

<Structure of PIP Capacitive Element>

FIG. 6a is a plan view of a PIP capacitive element and FIG. 6b is a cross-sectional view showing the plane A-B of the PIP capacitive element. The PIP capacitive element is formed on a silicon oxide film formed on a silicon substrate. An effective capacitive portion is formed using an $SiO_2$ dielectric film 15 (film thickness of approximately 10 to 40 nm) sandwiched between an upper electrode 14 and a lower electrode 13 (film thickness of approximately 150 to 300 nm) formed of polysilicon. At the time of circuit design, the surface area of the effective capacitive portion is determined so as to meet a desired value of capacitance. The upper electrode 14 and the lower electrode 13 are electrically connected to upper wire lines 19 through contacts 16.

<Production Process of PIP Capacitive Element>

FIG. 7 is a production process flowchart of a PIP capacitive element. An explanation will hereinafter be made of the production flow of the aforementioned PIP capacitive element with reference to FIGS. 6 and 7.

First, an oxide film 12 is provided on the entire upper surface of a silicon substrate 11 and the lower electrode 13 of the PIP capacitive element is formed on the entire upper surface of the oxide film 12 (Step S001).

Next, a dielectric film (oxide film) 15 is formed on the entire upper surface of the lower electrode 13 (Step S002).

Then, the upper electrode 14 is formed on the entire upper surface of the dielectric film (oxide film) 15 (Step S003).

Next, photoresist is formed into a predetermined shape on the upper electrode 14 and the upper electrode 14 is etched into a predetermined shape (Step S004).

Following the etching of the upper electrode 14, the dielectric film (oxide film) 15 is also etched into a predetermined shape (Step 005).

Next, after removing the photoresist, another photoresist is formed again into a predetermined shape so as to cover the remaining upper electrode 14 and part of the exposed lower electrode 13, in order to etch the lower electrode 13 into a predetermined shape (Step 006).

Then, the photoresist is removed and a treatment is made so as to silicide the surfaces of the exposed upper electrode 14 and the lower electrode 13 (portions in FIG. 6 indicated by reference numerals 18) and reduce the resistances thereof (Step 007). At this point, the resistance of a portion, among the portions of the surface of the lower electrode 13, covered with the dielectric film (oxide film) 15 and the upper electrode 14 is not reduced.

Finally, after the entire surface of the PIP capacitive element is covered with an insulating film and the film-covered surface is flattened, contacts 16 reaching the surfaces of the lower electrode 13 and the upper electrode 14 are respectively formed from the surface of the insulating film and upper wire lines 19 to be connected to the contacts 16 are provided, thus completing the PIP capacitive element shown in FIG. 6.

In the silicidation process of Step S007 described above, there are formed two types of regions having different sheet resistances in the lower electrode of the PIP capacitive element, i.e., a region which is not overlapped with the upper electrode 14 and the resistance of which is reduced and a region which is overlapped with the upper electrode 14 and the resistance of which is not reduced, since the resistance of a portion, among the portions of the lower electrode 13, overlapping with the upper electrode 14 is not reduced. Since these sheet resistances differ by approximately two orders of magnitude from each other and significantly contribute to the high frequency characteristics of the PIP capacitive element, it is necessary to precisely measure the values of both resistances and provide the results of measurement for simulation. However, since the high-resistance portion is short-circuited with the low-resistance portion as described above and, therefore, the low resistance is included in a measured value when an attempt is made to measure the parasitic component of the higher of these two resistances, it is difficult to precisely measure the value of the high-resistance portion.

Note that the above-described silicidation process is necessary in order to reduce the parasitic and contact resistances of the gate electrodes, sources, drains and contacts of transistors mixedly formed on the same wafer. In addition, for reasons of the production process of the PIP capacitive element, there is a constraint that the silicidation process must unavoidably be performed after film-forming the upper electrode.

Under the premise noted above, the inventors of the present application have considered measurement patterns for measuring the values of two types of parasitic resistances present in the above-described lower electrode. Now, an explanation will be made of problems with these measurement patterns.

<Measurement Pattern 1 Considered>

FIG. 8a is a plan view of Measurement Pattern 1 considered and FIG. 8b is a cross-sectional view of the plane A-B of the measurement pattern. As shown in the cross-sectional view of FIG. 8b, Measurement Pattern 1 has a layout wherein the lower electrode 13 is transversally covered by the upper electrode 14 so that any low-resistance portion (silicided portion) is not formed between the contacts 16 at the time of silicidation treatment. In other words, the short-circuiting current path of the silicided portion is shut off at the upper electrode 14 so that any short-circuit component due to the low-resistance portion (silicided portion) does not develop when measuring the high-resistance portion of the lower electrode 13, thereby making it possible to precisely measure the resistance value of the high-resistance portion. Note that in Measurement Pattern 1, there are disposed as many contacts 16 as possible for electrical connection between upper wire lines 20 for measurement and the lower electrode 13, in order to reduce the parasitic resistance component resulting from measurement. Each of upper wire lines 20 is connected to a corresponding pad(not shown in the figure) for measuring resistance of the high-resistance portion.

<Problems With Measurement Pattern 1 Considered>

To create Measurement Pattern 1, the lower electrode 13 must be formed smaller than the upper electrode 14 at least in the crosswise (width) direction of FIG. 8. However, in the production flow of FIG. 7 described above, the exposed lower electrode 13 can only be etched by first film-forming the lower electrode 13, the dielectric film (oxide film) 15 and the upper electrode 14 on the entire surface of the PIP capacitive element, and then etching from the uppermost surface to the upper electrode 14 and the dielectric film (oxide film) 15 in this order. Consequently, in the production flow shown in FIG. 7, it is not possible to form the lower electrode 13 smaller than the upper electrode 14.

In order to form the lower electrode 13 smaller than the upper electrode 14, the order of steps shown in the production flow of FIG. 7 must be changed. For example, the order of steps may be changed so that the film-formation of the lower electrode (Step S001) and pattern formation (etching) (Step S006) are followed by the formation of the oxide film (Step S002), the film-formation of the upper electrode (Step S003) and the etching of the upper electrode (Step S004).

However, such a change in the order of steps as described above is hardly acceptable since it also means a change in the steps of the production process flow of the PIP capacitive element and has a significant influence on the production steps of transistors contained in the same wafer. In addition, such a change requires process development for the purpose of creating the measurement pattern and, therefore, this measurement pattern is inadvisable also from the viewpoint of development turnaround time and costs.

Another point to note is that since the production process is made to differ from the normal production steps of the PIP capacitive element, Measurement Pattern 1 has the problem that it is not possible either to precisely monitor the sheet resistance of the lower electrode in the production steps of the PIP capacitive element.

<Measurement Pattern 2 Considered>

FIG. 9a is a plan view of Measurement Pattern 2 considered and FIG. 9b is a cross-sectional view of the plane A-B of the measurement pattern. Measurement Pattern 2 differs from Measurement 1 in that the width (A-B direction in FIG. 9) of the upper electrode 14 has been made to agree with that of the lower electrode 13 so that there is no need to change the order of steps in the existing production flow. This Measurement Pattern 2 is also adapted so that any low-resistance portion (silicided portion) is not formed between contacts 16. Thus it is possible to precisely measure the resistance value of a high-resistance portion.

<Problems With Measurement Pattern 2 Considered>

However, in order to create Measurement Pattern 2, patterning must be performed online so that both ends of the upper electrode 14 agree with those of the lower electrode 13. For process reasons, it is extremely difficult technically to form a pattern without allowing the lower electrode 13 to shift from the upper electrode 14.

Considering that it is difficult to perform patterning completely online and that there may occur a mismatch in mask alignment more or less during production, as shown in FIG. 10, a low-resistance portion arises as in the case of conventional pattern configuration.

FIG. 10a is a schematic cross-sectional view at a point in time when in the production flow of FIG. 7, the etching of the upper electrode 14 in Step S004 is completed and resist 21 is formed to etch the lower electrode 13. In the figure, there is a mismatch in mask alignment and the resist 21 applied when forming the lower electrode 13 is formed on the left side of the upper electrode 14 so as to overhang the lower electrode 13.

FIG. 10b is a schematic cross-sectional view at a point in time when in the production flow of FIG. 7, the etching of the lower electrode 13 is completed. As the result of the mask misalignment noted above, the resist 21 has failed to mask the upper electrode 14 in the step of etching the lower electrode 13, thus resulting in the overetching of an edge (right-side edge in the figure) of the upper electrode 14. Consequently, the edge (right-side edge in the figure) of the upper electrode 14 has shifted inward from an edge (right-side edge in the figure) of the lower electrode 13. Therefore, there has arisen a portion that cannot be etched due to the presence of resist 21 formed on the lower electrode 13 and an edge (left-side edge in the figure) of the lower electrode 13 has shifted outward from an edge (left-side edge in the figure) of the upper electrode 14.

FIG. 10c is a schematic cross-sectional view at a point in time when in the production flow of FIG. 7, the resist 21 has been removed after the lower electrode 13 is etched. Eventually, as illustrated in the figure, there has arisen an exposed portion in the lower electrode 13, resulting in the formation of a low-resistance portion (silicided portion).

Consequently, under the premise that a mismatch in mask alignment more or less occurs, it is not possible to precisely monitor the sheet resistance of the lower electrode even with Measurement Pattern 2.

As described heretofore, since the abovementioned two measurement patterns are either difficult to create or are not capable of completely shutting off the short-circuiting current path of a low-resistance portion, it is not possible to precisely measure the resistance value of the lower electrode. Hence, on the premise that there always exists a low-resistance component due to the abovementioned low-resistance portion (silicided portion), there are proposed measurement patterns whereby it is possible to analytically remove the low-resistance component and determine the sheet resistance of a high-resistance portion and an analysis method using the measurement patterns.

SUMMARY OF THE INVENTION

The present invention seeks to solve one or more of the above problems, or to improve upon those problems at least in part.

According to one embodiment of the present invention, there is provided a semiconductor device comprising at least a first, a second, a third and a fourth resistive element. Each of the resistive elements comprises: a lower layer conductive pattern; an insulating layer formed on the lower layer conductive pattern; an upper layer conductive pattern formed on the insulating layer, having a smaller outline than the lower layer conductive pattern, and having a pair of openings to define a rectangular region therebetween; and a plurality of contacts respectively penetrating through the pair of openings from above the upper layer conductive pattern and reaching the lower layer conductive pattern. A rectangular region of the first resistive elements has a first width and a first length, a rectangular region of the second resistive elements has said first width and a second length different from the first length, a rectangular element of the third resistive element has a second width different from the first width and the first length, and a rectangular region of the fourth resistive elements has the second width and the second length. Each of the widths has a first side adjacent to one of the openings, and each of said lengths has a second side in contact with said first side.

With this semiconductor device, it is possible to easily measure the sheet resistance of the lower layer conductive pattern.

Also according to one embodiment of the present invention, there is provided a method of measuring a sheet resistance of a portion of the lower layer covered by the upper layer conductive pattern of the semiconductor device, comprising: measuring resistances between the contacts regarding each of the resistive elements; and deriving sheet resistance thereof from the measured resistances, thereby making it possible to determine the sheet resistance of the portion of the lower layer conductive pattern covered by the upper layer conductive pattern from the values of width and length of the rectangular regions and the resistance values.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a production process flow chart of a PIP capacitive element;

FIG. 8a is a plan view of Measurement Pattern 1 considered and FIG. 8b is a cross-sectional view showing the plane A-B of the measurement pattern;

DETAILED DESCRIPTION OF THE PREFERRED EMBODIMENTS

The invention will be now described herein with reference to illustrative embodiments. Those skilled in the art will recognize that many alternative embodiments can-be accomplished using the teachings of the present invention and that the invention is not limited to the embodiments illustrated for explanatory purposes.

[Configuration of Measurement Pattern (Evaluation Pattern)]

Figures 1A, 1B, 2:
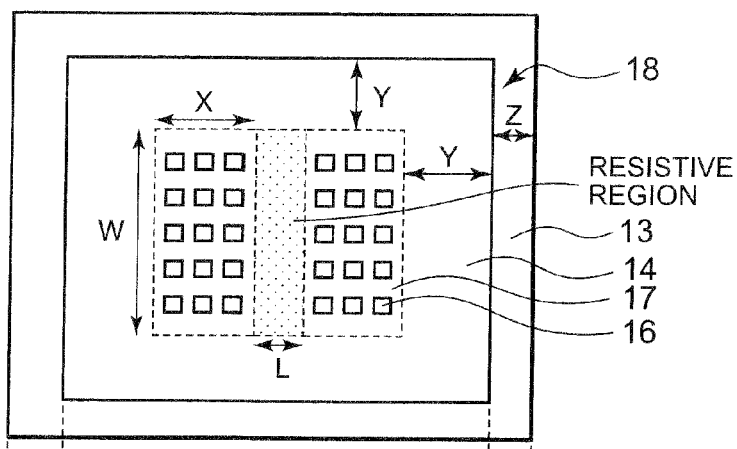
FIG. 1a is a plan view of a measurement pattern in accordance with the first embodiment of the present invention and FIG. 1b is a cross-sectional view showing the plane A-B of the measurement pattern.
FIG. 2 is an example of a table of standard values of W and L used in measurement patterns.

FIG. 1a is a plan view of a resistive element (evaluation pattern) in accordance with the first embodiment of the present invention and FIG. 1b is a cross-sectional view showing the plane A-B of the resistive element. The measurement pattern of the present embodiment structurally has approximately the same configuration as that of a PIP capacitive element and is created according to the production flow shown in FIG. 7. What is added for low-resistance measurement is that, as shown in FIG. 1, a pair of rectangular contact holes (openings) 17 having length X and width W are created in the upper electrode 14 and the dielectric film (oxide film) 15 and the lower electrode 13 is electrically connected through the contacts 16 to the upper layer wire line 20 for measurement. Each of upper wire lines 20 is connected to a corresponding pad (not shown in the figure) for measuring resistance of a portion between openings 17 of the lower electrode.

The lower electrode 13 is laid out so that the area of a silicided region 18 having width Z of exposure from the overlying upper electrode 14 and the dielectric film (oxide film) 15 (distance from the outer edge of the upper electrode 14 to the outer edge of the lower electrode 13) is minimized to attenuate influence upon measured resistance values as much as possible.

The contact holes (openings) 17 are disposed sufficiently distant from the edges of the upper electrode 14 (Y in the figure) so that the influence of the silicided portion included in the measured resistance values is minimized. It is preferred that the distance Y from an edge of the upper electrode 14 to an edge of the contact hole (opening) 17 be larger than a distance L between the contact holes (openings) 17 to be discussed later, larger than the length X (diameter in the direction orthogonal to the width W) of the contact holes (openings) 17, and larger than the width Z of exposure of the lower electrode 13 from the upper electrode 14. For example, the distance Y can be set to 20 μm or larger to suppress the influence of the silicided portion. In addition, the length X of the contact holes (openings) 17 may be set to, for example, 2 μm.

Furthermore, as many contacts 16 as permitted by design criteria are densely disposed within the contact holes (openings) 17 so that a parasitic resistance component resulting from measurement can be reduced.

In order to precisely estimate the resistance value of a high-resistance portion in an analytical manner, it is necessary to vary a rectangular area (W*L) between the contact holes (openings) 17 defined by the length L between the contact holes (openings) 17 and the width W thereof. The reason for this is explained in the following section, [Procedure for Analyzing High-resistance Portion of Lower Electrode]. Therefore, there are created four or more measurement patterns having two different values of the width W of the rectangular region between the contact holes 17 respectively combined with different values of the distance L. Note that no parts other than the rectangular area (W*L) between the contact holes 17 are varied among the four or more measurement patterns. In other words, every measurement pattern has the same values of X, Y and Z.

FIG. 2 is an example of a table of standard values of W and L used in the measurement patterns. In this table of standard values, a total of six measurement patterns can be created since three standard values of the width W (2 μm, 4 μm and 10 μm) of the contact holes (openings) are set for each of two standard values of distance L (2 μm and 5 μm) between the contact holes (openings) 17. Hereinafter, an explanation will be made provided that measurement is performed using the six measurement patterns shown in the figure. However, as described earlier, it is possible to determine the sheet resistance of the high-resistance portion of the lower electrode 13 by creating a total of four measurement patterns, two measurement patterns out of combinations of standard values No. 1 to No. 3 and another two measurement patterns out of combinations of standard values No. 4 to No. 6, and measuring the resistance values of these measurement patterns.

[Procedure For Analyzing High-resistance Portion of Lower Electrode]

Figure 3:
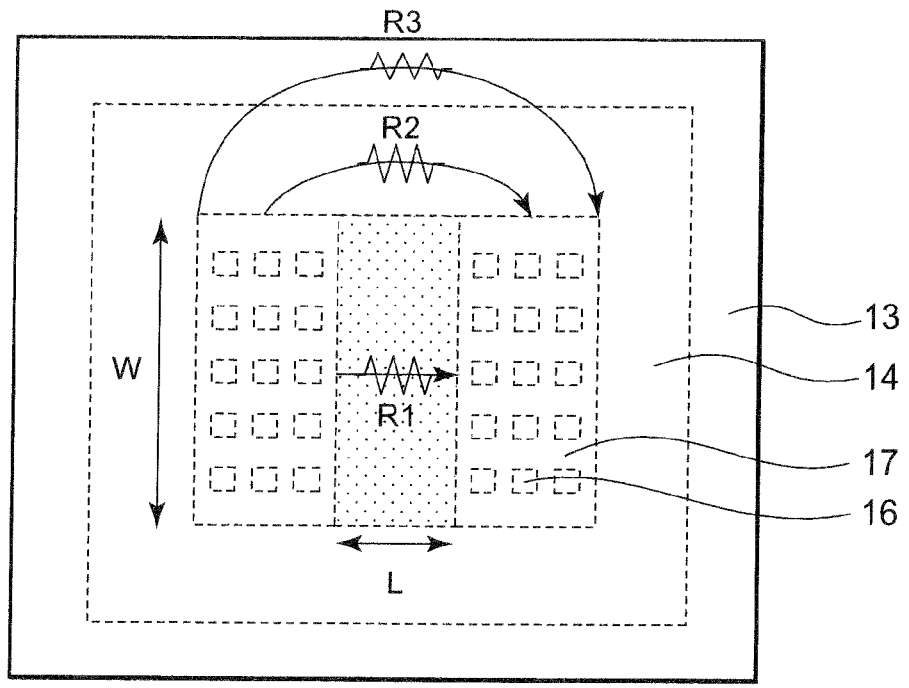
FIG. 3 is a schematic view showing the paths of currents flowing between the contacts (openings) of a measurement pattern in accordance with the first embodiment of the present invention.

First, the resistance of the path of a current flowing between the two contact holes (openings) 17 is measured as resistance R (measure) to determine the resistance value of the lower electrode 13. The resistance R (measure) to be measured contains three resistive components as shown in FIG. 3, i.e., the resistive component R1 of the rectangular portion between the contact holes (openings) 17, a resistive component R2 detouring along a side (overlapping portion of the upper electrode 14) of the contact holes 17, and a resistive component R3 detouring through the silicided portion of the lower electrode 13.

Since these resistive components can be assumed as being connected in parallel, the resistance R (measure) can be represented by Formula 1 shown below.

$$R_{(measure)} = \frac{1}{\frac{1}{R_1} + \frac{1}{R_2} + \frac{1}{R_3}} \quad (1)$$

Then, using the values of the resistance R (measure) for the six measurement patterns on the same substrate shown in FIG. 2, it is possible to precisely extract the sheet resistance ρs of the high-resistance portion of the lower electrode.

Figure 4:
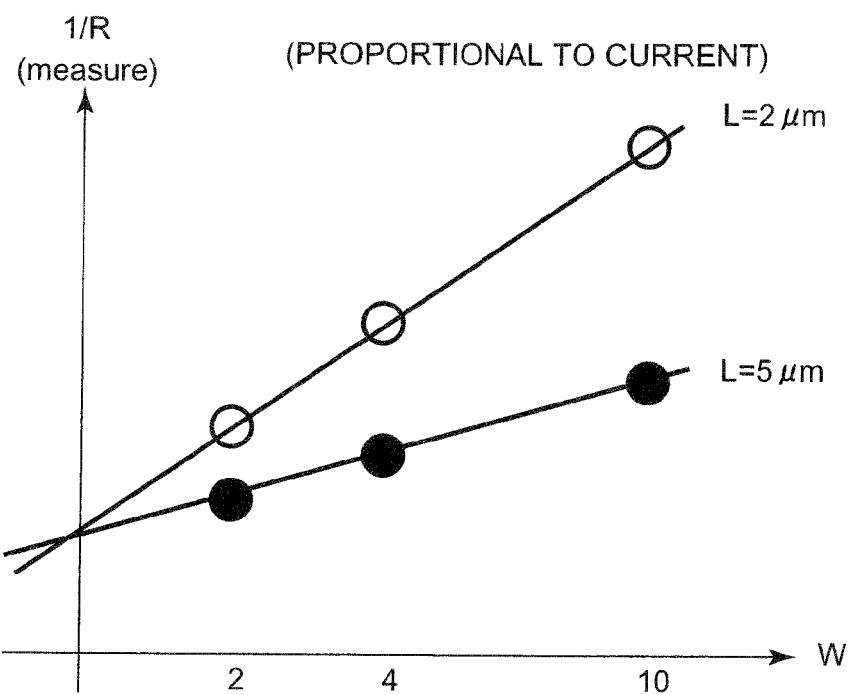
FIG. 4 is a graphical representation showing the dependence on W of currents flowing between the contacts (openings) of a measurement pattern in accordance with the first embodiment of the present invention.

FIG. 4 is a graphical representation showing the dependence on W of a current flowing between the contact holes (openings) 17 of a measurement pattern. The vertical axis of the figure denotes 1/R (measure), a value proportional to the current flowing between the contact holes (openings) 17, and the horizontal axis denotes the width W of the contact holes (openings) 17. As shown in the figure, the current flowing between the contact holes (openings) 17 increases in proportion to an increase in W.

At this point, only the resistance component R1 varies in association with the width W of the contact holes (openings) 17 in Formula 1 shown above and the resistive components R2 and R3 remain constant. This is obvious from the fact that shapes and dimensions other than W are kept constant among measurement patterns wherein only the width W of the contact holes (openings) 17 differs.

Hence, the reciprocal number of a gradient in this case equals the resistance R per W=1 μm. This resistance R per W=1 μm contains the resistances of contacts on both sides densely disposed per W=1 μm. In addition, 1/R=0 does not hold true at the ordinate intercept (W=0). This is because the values of currents flowing through detouring resistive components R2 and R3 are observed.

From the foregoing description, the current flowing between the contact holes (openings) 17 can be represented by Formula 2 shown below. Accordingly, from the intercept and the gradient, it is possible to separate the current into a component flowing through the rectangular portion (R1 in Formula 1) between the contact holes (openings) 17 and components detouring through other portions (R2 and R3 in Formula 1).

$$\frac{1}{R_{(measure)}} = \frac{1}{R_{(w=1 \, \mu m)}} * W + \frac{1}{R_t} \quad (2)$$

Figure 5:
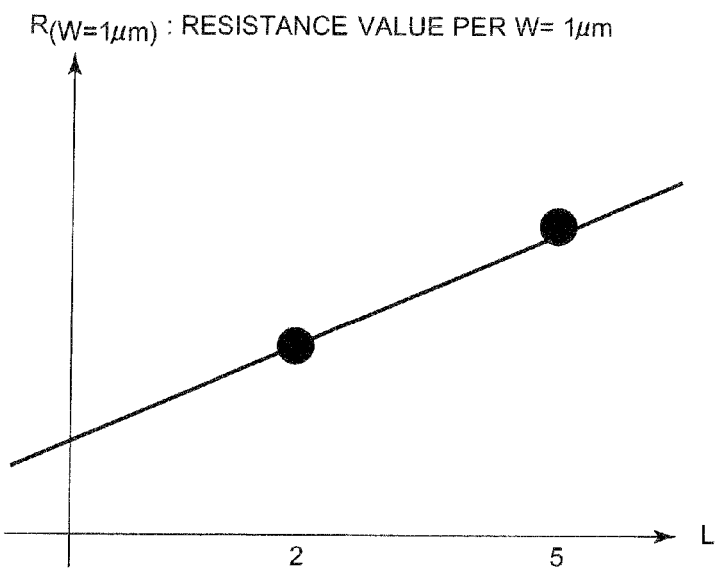
FIG. 5 is a graphical representation showing the dependence on L of resistance values per W=1 μm in a measurement pattern in accordance with the first embodiment of the present invention.
Figure 6A:
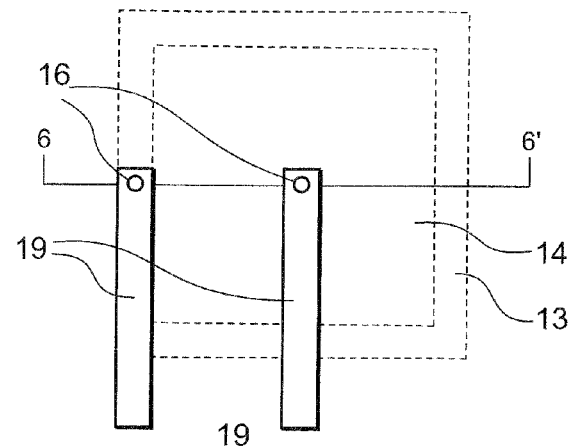
FIG. 6a is a plan view of a PIP capacitive element and FIG. 6b is a cross-sectional view showing the plane A-B of the PIP capacitive element.
Figure 6B:
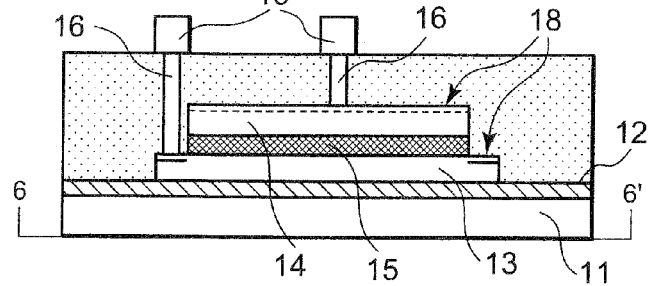
Figure 9A:
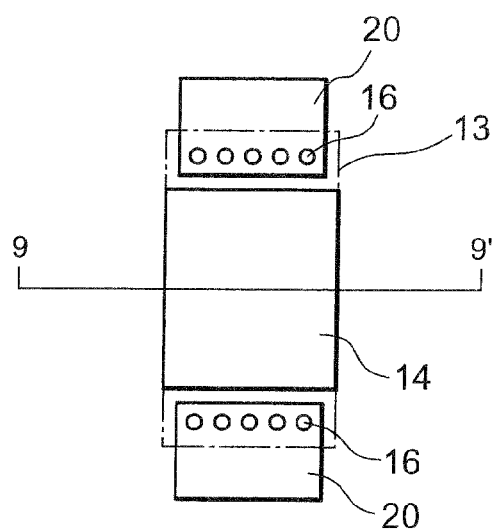
FIG. 9a is a plan view of Measurement Pattern 2 considered and FIG. 9b is a cross-sectional view showing the plane A-B of the measurement pattern.
Figure 9B:
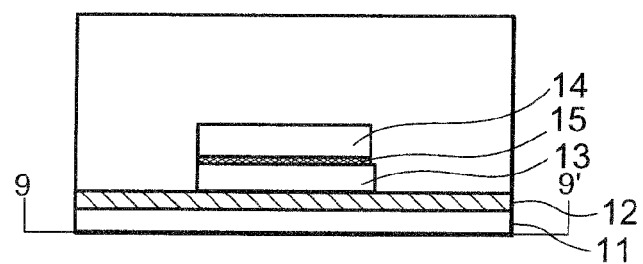
Figure 10A:
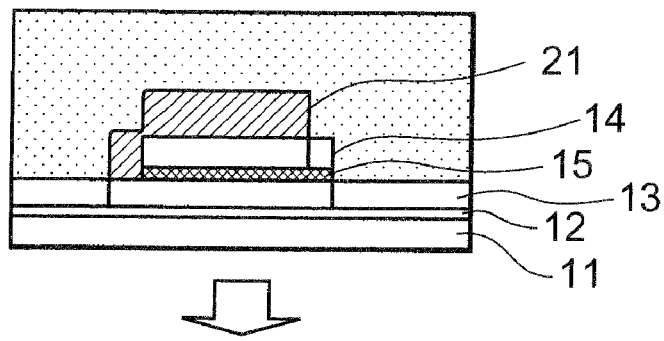
FIG. 10a to c is a schematic view intended to explain problems with Measurement Pattern 2 considered.
Figure 10B:
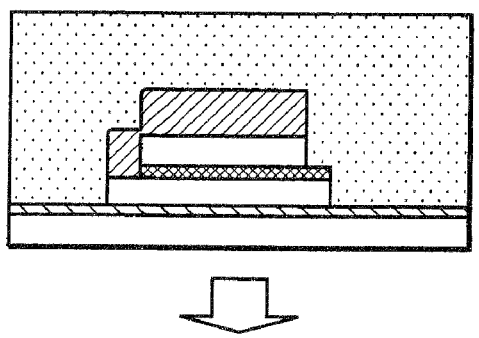
Figure 10C:
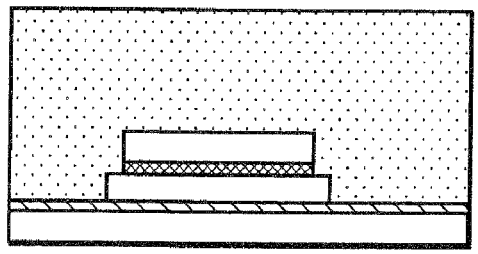

Plotting the resistance R per W=1 μm determined from the reciprocal number of the gradient of the graph shown in FIG. 4 with respect to the distance L between the contact holes (openings) 17 results in a graph shown in FIG. 5. As shown in the figure, the resistance value per W=1 μm increases in proportion to an increase in the distance L between the contact holes (openings) 17. The gradient in this case equals the sheet resistance ρs of the high-resistance portion of the lower electrode 13 in Formula 3 shown below.

$$R_{(w=1 \, \mu m)} = \rho s * L + 2 * R_p \quad (3)$$

Note that the resistance R (W=1 μm) does not equal 0 at the ordinate intercept (L=0). This is because parasitic resistances (single-side measurement: Rp) resulting from measurement, such as a contact resistance, the resistance of an upper layer measurement wire line, and a contact resistance between the pad and a measuring probe, are observed.

As described above, it is possible to precisely extract the sheet resistance ρs of the high-resistance portion of the lower electrode 13 by separating a detouring resistive component Rt from a parasitic resistance Rp resulting from measurement according to intercept values in Formulas 2 and 3.

As described heretofore, according to the measurement patterns in accordance with the present invention, it is possible to precisely estimate the parasitic resistance (high-resistance portion) of the lower electrode of a PIP capacitive element and the like. It is also a major advantage of the measurement patterns in accordance with the present invention that the measurement patterns can be created under the existing process conditions of a PIP capacitive element or the like and, therefore, do not require any extra development costs and turnaround time.

While preferred embodiments of the present invention have been described heretofore, it is needless to say that various modifications may be applied to the present invention without departing from the subject matter of thereof that there are provided a plurality of openings having an opening-to-opening distance L and an opening width W on the upper layer conductive pattern of a semiconductor device containing elements configured between conductive patterns with an insulating layer positioned therebetween so that an approximately rectangular region (quadrangular region) defined by W and L is formed between the openings, and there are formed four or more types (2×2) of evaluation patterns provided with contacts penetrating through the openings from above the upper layer conductive pattern and reaching the lower layer conductive pattern, wherein two or more standard values each of the width W and the distance L are set in the evaluation patterns. For example, although in the embodiment described above, an explanation has been made by taking a PIP capacitive element as an example, it is needless to say that the present invention is also applicable to the evaluation of other elements having similar structures.

Likewise, although in the embodiment described above, an explanation has been made by taking an example wherein six measurement patterns are used, at least four patterns will suffice to determine the gradients and ordinate intercepts of the graphs shown in FIGS. 4 and 5. It is therefore needless to say that even more accurate measurement is possible with six or more patterns.

Having thus described the present invention in connection with the foregoing embodiment, it is apparent that the present invention is not limited to the above embodiments, but may be modified and changed without departing from the scope and spirit of the invention.

What is claimed is:

1. A semiconductor device comprising at least a first, a second, a third, and a fourth resistive elements, wherein each of said resistive elements comprises:
   a lower layer conductive pattern;
   an insulating layer formed on said lower layer conductive pattern;
   an upper layer conductive pattern formed on said insulating layer, having a smaller outline than said lower layer conductive pattern, and having a pair of openings to define a rectangular region therebetween; and
   a plurality of contacts respectively penetrating through said pair of openings from above said upper layer conductive pattern and reaching said lower layer conductive pattern,
   wherein a rectangular region of said first resistive elements has a first width and a first length, a rectangular region of said second resistive elements has said first width and a second length different from said first length, a rectangular element of said third resistive element has a second width different from said first width and said first length, and a rectangular region of said fourth resistive elements has said second width and said second length, each of said widths having a first side adjacent to one of said openings, and each of said length having a second side in contact with said first side, and
   wherein each of said resistive elements is an evaluation pattern for measuring the sheet resistance of a portion of said lower layer conductive pattern not covered by said upper layer conductive pattern.

2. The semiconductor device according to claim 1, wherein the shortest distance from the openings of each of said resistive elements to the outer edge of said upper layer conductive pattern is larger than the maximum width of said rectangular regions.

3. The semiconductor device according to claim 1, wherein the shortest distance from the openings of each of said resistive elements to the outer edge of said upper layer conductive pattern is larger than the maximum length of said rectangular regions.

4. The semiconductor device according to claim 1, wherein the shortest distance from the openings of each of said resistive elements to the outer edge of said upper layer conductive pattern is larger than the shortest distance from the outer edge of said upper layer conductive pattern to the outer edge of said lower layer conductive pattern.

5. The semiconductor device according to claim 1, wherein the shortest distance from the openings of each of said resistive elements to the outer edge of said upper layer conductive pattern is twice or more the maximum width of said rectangular regions and four times or more the maximum length of said rectangular regions.

6. The semiconductor device according to claim 1, wherein the shortest distance from the openings of each of said resistive elements to the outer edge of said upper layer conductive pattern is ten times or more the length of the narrow side of each openings.

7. The semiconductor device according to claim 1, wherein the sheet resistance of a portion of said lower layer conductive pattern covered by said upper layer conductive pattern is ten times or more larger than the sheet resistance of a portion of said lower layer conductive pattern riot covered by said upper layer conductive pattern.

8. The semiconductor device according to claim 1, wherein each of said resistive elements is an evaluation pattern for measuring the sheet resistance of a portion of said lower layer conductive pattern not covered by said upper layer conductive pattern of a capacitive element formed between said upper layer conductive pattern and said lower layer conductive pattern.

9. The semiconductor device according to claim 1, wherein said semiconductor device is a semiconductor wafer wherein circuit patterns to be formed into a plurality of semiconductor chips are formed on the surface of a semiconductor substrate.

10. A method of measuring a sheet resistance of a portion of a lower layer conductive pattern not covered by an upper layer conductive pattern of a semiconductor device using a first, second, third and fourth resistive elements, wherein each of said resistive elements comprises:
    a lower layer conductive pattern;
    an insulating layer formed on said lower layer conductive pattern;
    an upper layer conductive pattern formed on said insulating layer, having a smaller outline than said lower layer conductive pattern, and having a pair of openings to define a rectangular region therebetween; and
    a plurality of contacts respectively penetrating through said pair of openings from above said upper layer conductive pattern and reaching said lower layer conductive pattern,
    wherein a rectangular region of said first resistive elements has a first width and a first length, a rectangular region of said second resistive elements has said first width and a second length different from said first length, a rectangular element of said third resistive element has a second width different from said first width and said first length, and a rectangular region of said fourth resistive elements has said second width and said second length, each of said widths having a first side adjacent to one of said openings, and each of said length having a second side in contact with said first side, and
    wherein each of said resistive elements is an evaluation pattern for measuring the sheet resistance of a portion of said lower layer conductive pattern not covered by said upper layer conductive pattern, the method comprising:
    measuring resistances between said contacts of each of said resistive elements; and
    deriving the sheet resistance thereof from said measured resistances.

11. The method of measuring the sheet resistance according to claim 10 wherein the step of deriving sheet resistance comprises:
    (a) determining a resistance value per a unit width of said lower layer conductive pattern from measured resistances of resistive elements having the same length and a different width of said rectangular regions;
(b) repeating said step (a) while varying the value of length of the resistive elements; and
(c) determining a resistance value per unit width and a resistance value per unit length of said rectangular regions from resistance values determined in said steps (a) and (b), thereby determining the sheet resistance of said portion of said lower layer conductive pattern not covered by said upper layer conductive pattern.

* * * * *